United States Patent
Hikosaka et al.

(10) Patent No.: US 7,518,173 B2
(45) Date of Patent: Apr. 14, 2009

(54) SEMICONDUCTOR DEVICE HAVING FERROELECTRIC CAPACITOR AND ITS MANUFACTURE METHOD

(75) Inventors: Yukinobu Hikosaka, Kawasaki (JP); Mitsushi Fujiki, Kawasaki (JP); Kazutoshi Izumi, Kawasaki (JP); Naoya Sashida, Kawasaki (JP); Aki Dote, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 104 days.

(21) Appl. No.: 11/129,490

(22) Filed: May 16, 2005

(65) Prior Publication Data

US 2006/0157762 A1 Jul. 20, 2006

(30) Foreign Application Priority Data

Jan. 18, 2005 (JP) .............................. 2005-010672

(51) Int. Cl.
*H01L 29/41* (2006.01)
*H01L 29/43* (2006.01)

(52) U.S. Cl. .............................. 257/295; 257/E21.664; 257/E27.104; 365/49.13; 365/145

(58) Field of Classification Search ................. 257/295, 257/E21.663, E21.664
See application file for complete search history.

(56) References Cited

U.S. PATENT DOCUMENTS

| 6,210,979 B1 | 4/2001 | Kweon et al. |
| 6,635,528 B2 * | 10/2003 | Gilbert et al. ............... 438/253 |
| 2003/0127703 A1 | 7/2003 | Hikosaka et al. |

2004/0113189 A1 * 6/2004 Takamatsu et al. ......... 257/295

FOREIGN PATENT DOCUMENTS

| CN | 1431713 A | 7/2003 |
| JP | 5-315284 | 11/1993 |
| JP | 10-261767 | 9/1998 |
| JP | 10-293698 | 11/1998 |

(Continued)

OTHER PUBLICATIONS

Office Action dated May 26, 2006, issued in corresponding Korean application No. 10-2005-0039667.

(Continued)

*Primary Examiner*—David Vu
*Assistant Examiner*—Earl N Taylor
(74) *Attorney, Agent, or Firm*—Westerman, Hattori, Daniels & Adrian, LLP.

(57) ABSTRACT

A semiconductor device includes: a semiconductor substrate; a MOS transistor formed in the semiconductor substrate and having an insulated gate and source/drain regions on both sides of the insulated gate; a ferroelectric capacitor formed above the semiconductor substrate and having a lower electrode, a ferroelectric layer and an upper electrode; a metal film formed on the upper electrode and having a thickness of a half of or thinner than a thickness of the upper electrode; an interlayer insulating film burying the ferroelectric capacitor and the metal film; a conductive plug formed through the interlayer insulating film, reaching the metal film and including a conductive glue film and a tungsten body; and an aluminum wiring formed on the interlayer insulating film and connected to the conductive plug. A new problem near an upper electrode contact is solved which may otherwise be caused by adopting a W plug over the F capacitor.

6 Claims, 16 Drawing Sheets

FOREIGN PATENT DOCUMENTS

| | | |
|---|---|---|
| JP | 11-195768 | 7/1999 |
| JP | 2000-349246 | 12/2000 |
| JP | 2001-189432 | 7/2001 |
| JP | 2001-358311 | 12/2001 |
| JP | 2002-530890 | 9/2002 |
| JP | 2002-299577 | 10/2002 |
| JP | 2003-152165 | 5/2003 |
| JP | 2003-197871 | 7/2003 |
| JP | 2003-258201 | 9/2003 |
| JP | 2004-193430 | 7/2004 |
| KR | 2000-44671 A | 7/2000 |
| KR | 2001-18256 A | 3/2001 |
| WO | WO 00/31794 | 6/2000 |

OTHER PUBLICATIONS

Chinese Office Action mailed Dec. 21, 2007, issued in corresponding Chinese patent application No. 200510072992X.

* cited by examiner

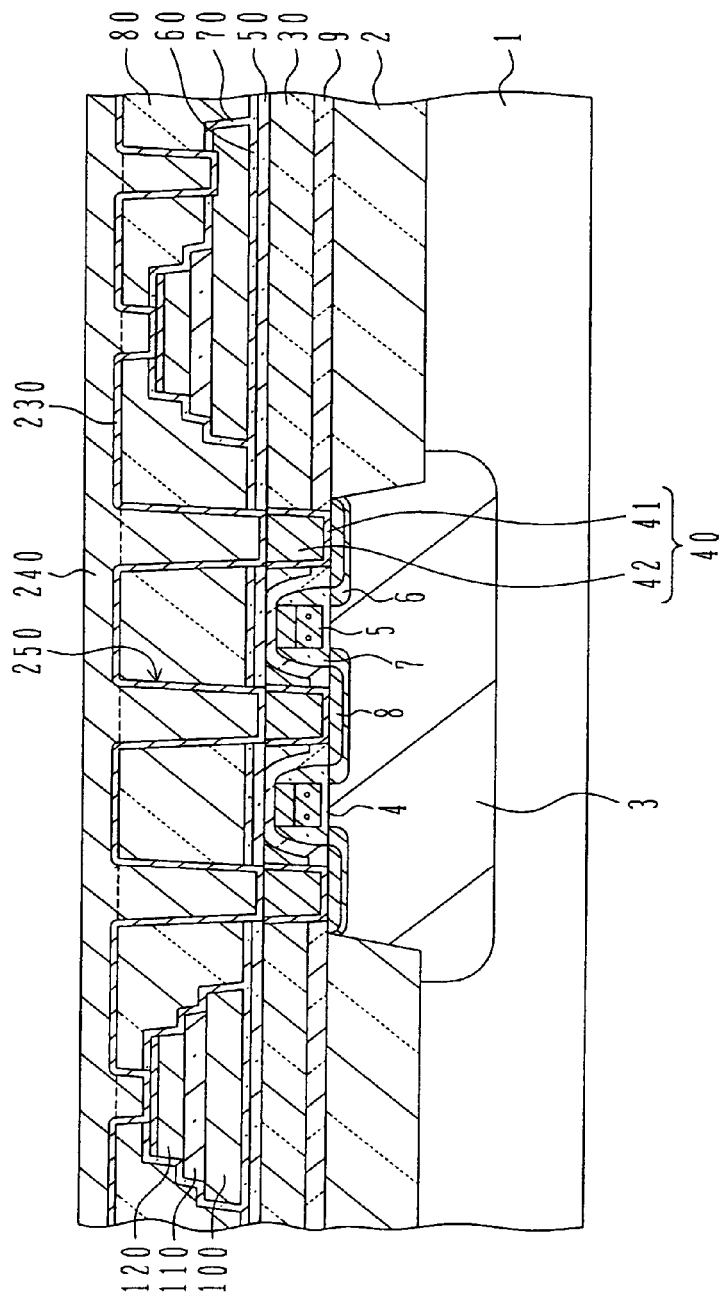
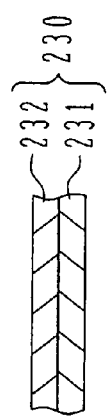
FIG. 7A
FIG. 7B

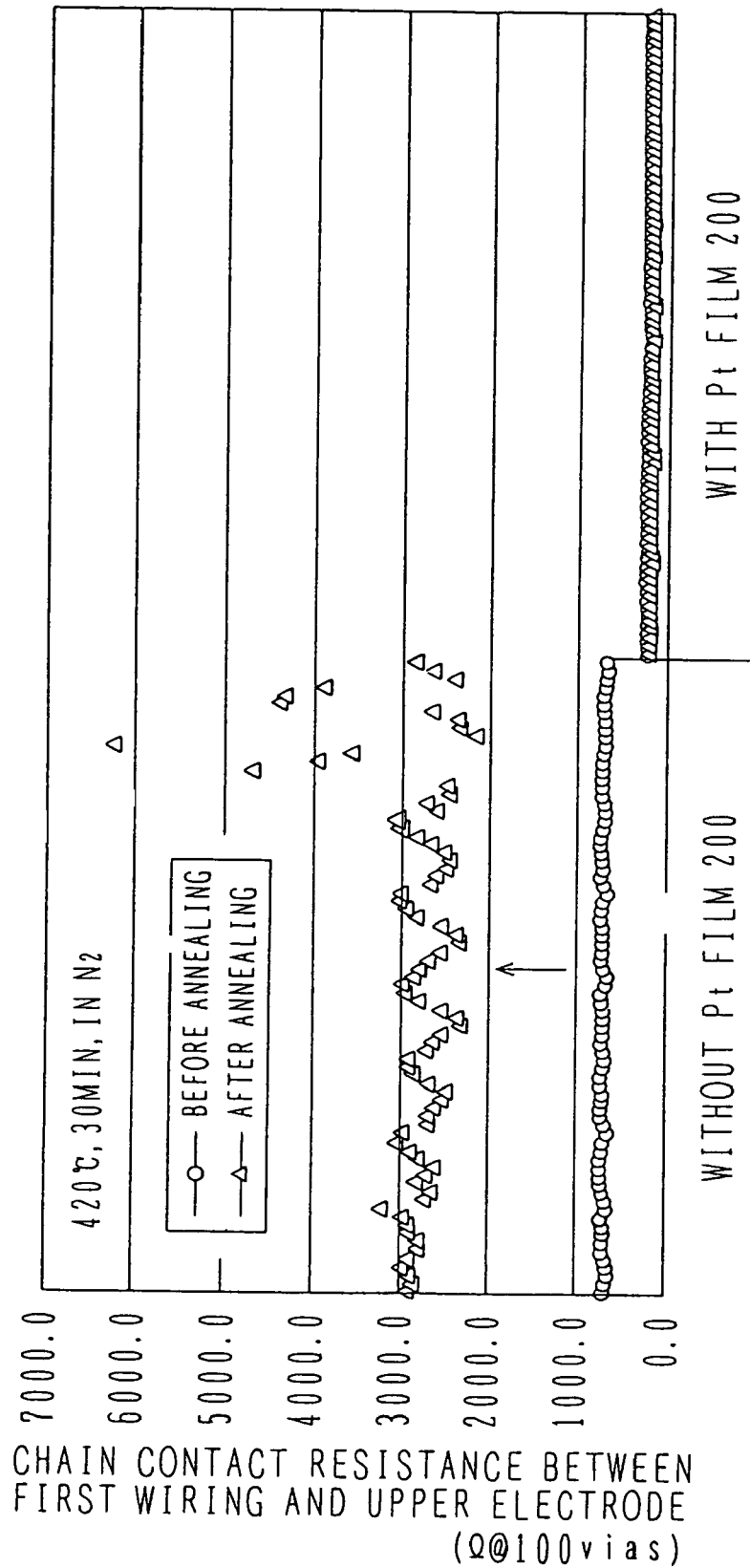

FIG.14A

| | STEP | TIME (sec) | PRESS (Pa) | TEMP (°C) | WF6 (sccm) | Ar (sccm) | SiH4 (sccm) | H2 (sccm) | N2 (sccm) |
|---|---|---|---|---|---|---|---|---|---|
| | 1 | 2 | 0 | 410 | 0 | 0 | 0 | 0 | 0 |
| INITIAL DEPOSITION | 2 | 10 | 2667 | 410 | 0 | 2700 | 10 | 1000 | 600 |
| | 3 | 40 | 2667 | 410 | 0 | 400 | 18 | 400 | 600 |
| | 4 | 3 | 2667 | 410 | 15 | 800 | 4 | 1200 | 600 |
| | 5 | 86 | 2667 | 410 | 15 | 800 | 4 | 1200 | 600 |
| MAIN DEPOSITION | 6 | 15 | 2667 | 410 | 70 | 900 | 0 | 1500 | 100 |
| | 7 | 92 | 2667 | 410 | 90 | 900 | 0 | 750 | 100 |
| | 8 | 3 | 0 | 410 | 0 | 2700 | 0 | 750 | 500 |
| | 9 | 3 | 0 | 410 | 0 | 0 | 0 | 0 | 0 |
| PROCESS TIME | | 254 (sec) | | | | | | | |

FIG.14B

| | STEP | TIME (sec) | PRESS (Pa) | TEMP (°C) | WF6 (sccm) | Ar (sccm) | SiH4 (sccm) | H2 (sccm) | N2 (sccm) |
|---|---|---|---|---|---|---|---|---|---|
| | 1 | 2 | 0 | 410 | 0 | 0 | 0 | 0 | 0 |
| INITIAL DEPOSITION | 2 | 10 | 2667 | 410 | 0 | 2700 | 10 | 0 | 600 |
| | 3 | 40 | 2667 | 410 | 0 | 400 | 18 | 0 | 600 |
| | 4 | 3 | 2667 | 410 | 15 | 800 | 4 | 0 | 600 |
| | 5 | 86 | 2667 | 410 | 15 | 800 | 4 | 0 | 600 |
| MAIN DEPOSITION | 6 | 15 | 2667 | 410 | 70 | 900 | 0 | 1500 | 100 |
| | 7 | 92 | 2667 | 410 | 90 | 900 | 0 | 750 | 100 |
| | 8 | 3 | 0 | 410 | 0 | 2700 | 0 | 750 | 500 |
| | 9 | 3 | 0 | 410 | 0 | 0 | 0 | 0 | 0 |
| PROCESS TIME | | 254 (sec) | | | | | | | |

SEMICONDUCTOR DEVICE HAVING FERROELECTRIC CAPACITOR AND ITS MANUFACTURE METHOD

CROSS REFERENCE TO RELATED APPLICATION

This application is based on and claims priority of Japanese Patent Application No. 2005-010672 filed on Jan. 18, 2005, the entire contents of which are incorporated herein by reference.

BACKGROUND OF THE INVENTION

A) Field of the Invention

The present invention relates to a semiconductor device and its manufacture method, and more particularly to a semiconductor device having a ferroelectric capacitor and its manufacture method.

B) Description of the Related Art

Recent multiple function semiconductor devices have a strong need of mixedly fabricating a logic circuit and a memory. A logic circuit is often constituted of a CMOS circuit. Many manufacture processes for a CMOS circuit have already been established. A ferroelectric memory is not widely used which is a non-volatile memory whose contents are retained even if a power supply is cut off. There are many manufacture processes for a ferroelectric memory still not established. It is desired that the CMOS manufacture processes should not interfere with the ferroelectric capacitor manufacture processes.

Japanese Patent Laid-open Publication No. HEI-10-261767 discloses the manufacture process of: forming a MOS transistor in an active region defined by an element isolation field oxide film; forming an oxidation-duravble silicide layer; covering the MOS transistor with a silicon oxide layer; thereafter forming a Ti/Pt lower electrode, a PZT ferroelectric layer and a Pt upper electrode on the element isolation region in a tiered stand (stepped lamination) shape; covering the substrate with an interlayer insulating film; forming contact holes through the interlayer insulating film, the contact holes reaching the upper electrode, lower electrode and source/drain regions; and forming Ti/TiN/Al wirings.

Japanese Patent Laid-open Publication No. HEI-11-195768 discloses the manufacture method of forming a ferroelectric capacitor having a Pt/SRO lower electrode, a PZT ferroelectric layer and an SRO/Pt upper electrode, in which the SRO layer of the lower electrode is formed in an amorphous phase in a reduced pressure atmosphere and thereafter the SRO layer is subjected to heat treatment in an oxidizing atmosphere to crystallize it.

Japanese Patent Laid-open Publication No. 2003-258201 discloses the manufacture method of: burying (or embedding) a tungsten plug in an interlayer insulating film; forming an oxygen barrier conductive layer of Ir, TiN, TiAlN or the like on the interlayer insulating film; forming on the oxygen barrier conductive layer a lower electrode layer of a single layer or a lamination layer of an Ir layer, a Pt layer, an IrO layer, an SRO layer or the like; forming an oxide perovskite ferroelectric layer such as PZT, SBT, and BLT; forming on the oxide perovskite ferroelectric layer an upper electrode layer of a single layer or a lamination layer of a Pt layer, an Ir layer, an IrO layer, an SRO layer, a PtO layer or the like; forming a first hard mask layer of a TiN layer, a TaN layer, a TiAlN layer or the like and a second hard mask layer of silicon oxide; patterning the ferroelectric capacitor structure; covering the ferroelectric capacitor structure with an encapsulation film having a hydrogen shielding capability such as a $TiO_2$ layer and an $Al_2O_3$ layer, and an interlayer insulating layer of silicon oxide; forming a via hole reaching the upper electrode; and burying a tungsten plug in the via hole.

Japanese Patent Laid-open Publication No. 2003-152165 discloses the manufacture process of: forming a ferroelectric capacitor of a tiered stand shape above an element isolation region; covering the ferroelectric capacitor with an interlayer insulating film; forming contact holes through the interlayer insulating film to expose an upper electrode, a lower electrode and source/drain regions, burying a TiN hydrogen barrier layer and a W film in the contact holes to form conductive plugs, and forming aluminum wirings on the conductive plugs.

SUMMARY OF THE INVENTION

An object of the present invention is to solve the new problem caused by adopting a new structure.

Another object of the present invention is to provide a semiconductor device having a novel structure and a ferroelectric capacitor and its manufacture method.

According to one aspect of the present invention, there is provided a semiconductor device comprising:

a semiconductor substrate;

a MOS transistor formed in the semiconductor substrate and having an insulated gate and source/drain regions on both sides of the insulated gate;

a ferroelectric capacitor formed above the semiconductor substrate and having a lower electrode, a ferroelectric layer and an upper electrode;

a metal film formed on the upper electrode and having a thickness of a half of or thinner than a thickness of the upper electrode;

an interlayer insulating film burying the ferroelectric capacitor and the metal film;

a conductive plug formed through the interlayer insulating film, reaching the metal film and including a conductive glue film and a tungsten body; and an aluminum wiring formed on the interlayer insulating film and connected to the conductive plug.

According to another aspect of the present invention, there is provided a semiconductor device manufacture method comprising the steps of:

(a) forming a MOS transistor in a semiconductor substrate;

(b) forming a lower insulating layer above the semiconductor substrate, the lower insulating layer burying the MOS transistor;

(c) forming a conductive plug through the lower insulating layer and connected to the MOS transistor;

(d) forming on the lower insulating layer a lamination of a lower electrode layer, a ferroelectric layer, an upper electrode layer and a metal layer having a thickness of a half of or thinner than a thickness of the upper electrode layer and having a hydrogen resistance performance;

(e) pattering the lamination to form a ferroelectric capacitor structure including a lower electrode, a ferroelectric film, an upper electrode and a metal film;

(f) forming an interlayer insulating film burying the ferroelectric capacitor structure;

(g) forming a tungsten plug through the interlayer insulating film, the tungsten plug reaching the metal film; and (h) forming an aluminum wiring on the interlayer insulating film, the aluminum wiring being connected to the tungsten plug.

It is possible to mitigate the problems to be caused when the tungsten plug contacts the ferroelectric capacitor from the upper side.

BRIEF DESCRIPTION OF THE DRAWINGS

FIGS. 2A to 2D, FIGS. 3 to 6, FIGS. 7A and 7B, and FIGS. 8A to 8C are cross sectional views illustrating a method of manufacturing a semiconductor device having an FeRAM according to a first embodiment.

FIG. 9 is a graph showing measurement results of contact resistances of samples formed by the method of the first embodiment.

FIGS. 14A and 14B are tables listing processes of W film forming methods according to embodiments.

DESCRIPTION OF THE PREFERRED EMBODIMENTS

A logic circuit of a 0.18 μm rule uses aluminum wirings. Conventionally, a first aluminum layer of a logic circuit is formed by forming an aluminum alloy (Al—Cu) layer having a thickness of 360 nm on a barrier metal layer which is a lamination of a Ti layer having a thickness of 60 nm and a TiN layer having a thickness of 30 nm, and by depositing a barrier metal layer which is a lamination of a Ti layer having a thickness of 5 nm and a TiN layer having a thickness of 70 nm.

An upper electrode of an FeRAM of a 0.35 μm rule is made of an IrO layer and a lower electrode is made of a Pt layer. Contacts to the upper electrode and lower electrode are desired to be formed by aluminum wirings extending downward. The barrier metal layer for the first aluminum wiring of FeRAM is required to have a thickness of 100 nm or thicker, in order to suppress a resistance rise of the upper contact to be caused by oxidation of the Ti layer by oxygen from the upper electrode IrO and by a reaction between the lower electrode Pt and Al. For example, a TiN layer having a thickness of 150 nm is desired. The barrier metal layer of the first aluminum wiring of a logic circuit is thinner than the required thickness of a barrier metal layer in FeRAM. This requirement can be met by thickening the barrier metal layer to 150 nm for example.

In order to meet the requirements of high density and high precision, the design rule of FeRAM tends to be reduced, from the 0.35 μm rule to the 0.18 μm rule. The smaller the scale of the rule, processing aluminum wirings becomes more difficult, posing some problems of process precision and reliability. In order to retain a stable process precision, it is desired to thin an aluminum wiring.

With the 0.18 μm rule and smaller scale rules, it is difficult to thicken a barrier metal layer as opposed to the conventional FeRAM manufacture method. In order to retain stable processes, it is preferable to adopt the aluminum wiring structure same as that of a conventional logic circuit. In this connection, it is desired to adopt a tungsten plug when a contact to a ferroelectric capacitor electrode is formed from the upper side.

Figure 1A:
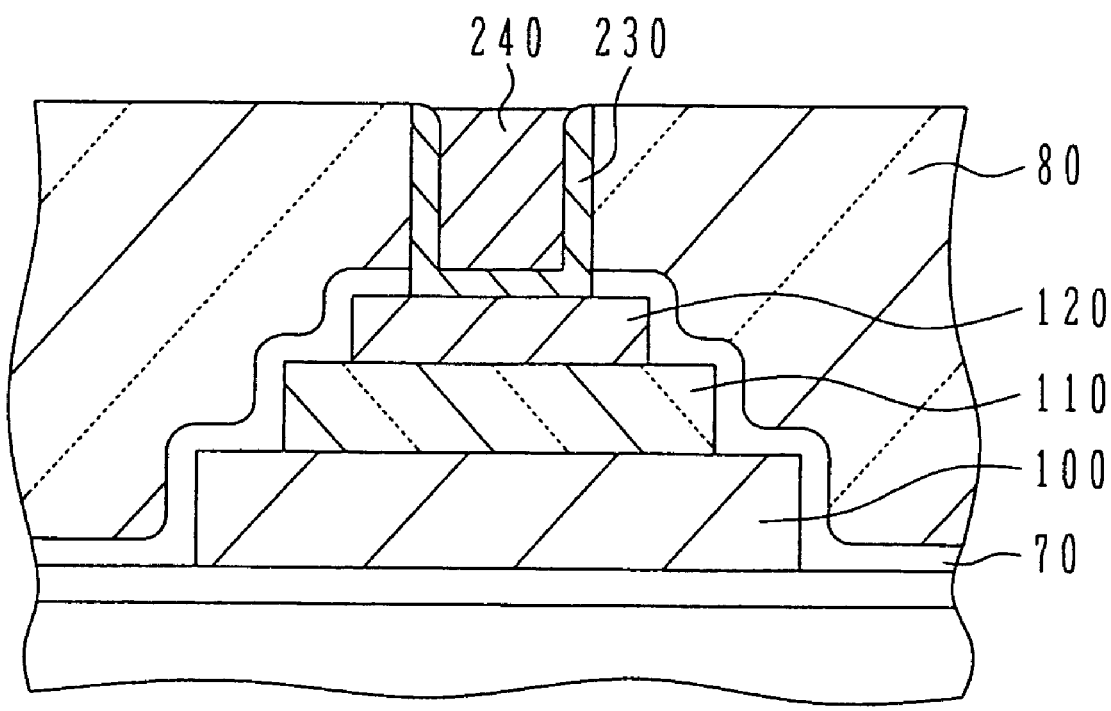
FIG. 1A is a cross sectional view showing an upper electrode contact portion of a ferroelectric capacitor used in preliminary studies.

As shown in FIG. 1A, a ferroelectric capacitor was formed by forming a Pt lower electrode 100, a PZT ferroelectric layer 110 and an IrO upper electrode 120. After the ferroelectric capacitor was covered with an alumina layer 70 and an interlayer insulating film 80, a contact hole was formed and a TiN glue film 230 and a W film 240 were buried (or embedded) in the contact hole to form a tungsten plug.

Figure 1B:
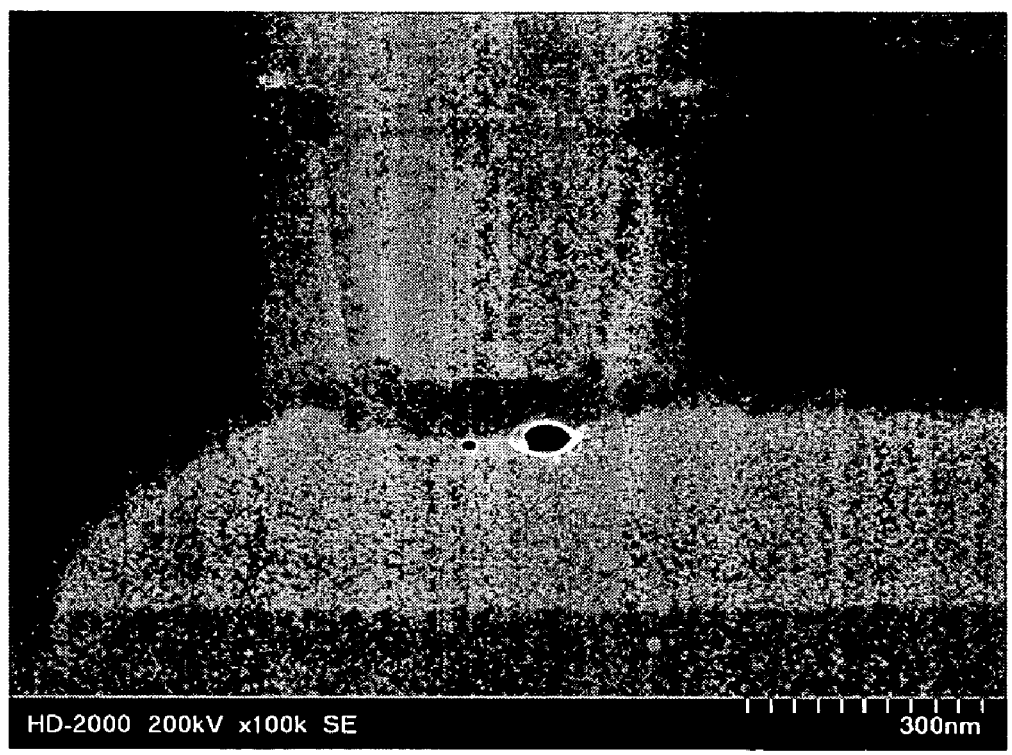
FIG. 1B is a SEM photograph showing the cross section of a prototype sample.

FIG. 1B is an secondary electron microscope (SEM) photograph showing a cross section of a sample having a defective contact to an upper electrode. A void is formed between the upper electrode and glue film. A contact between the upper electrode and glue film is incomplete and unstable.

A W film is deposited by reducing $WF_6$ by hydrogen at a high temperature. Although it can be considered that most hydrogen generated during film formation are blocked by the TiN glue film, if excessive hydrogen is supplied, it can be considered that hydrogen permeates (or penetrates) through a portion of the TiN glue film where the coverage is poor, and reaches the IrO upper electrode. If the IrO upper electrode is reduced and becomes Ir, then a volume contraction occurs and a void is formed between the TiN glue film and upper electrode. The contact resistance to the upper electrode becomes unstable.

Also in the conventional structure using an aluminum wiring for contacting an upper electrode, a tungsten plug has been used in some cases for the second or subsequent layer wirings. However, the above-described problem does not occur. Suppressing hydrogen from invading or attacking the upper electrode may be ascribed to that the position at which the W film is formed is remote from the upper electrode and that another barrier metal layer (or layers) serving as a hydrogen block film is involved. It can be judged that it is necessary to suppress hydrogen invasion when a W film is formed just above the upper electrode, with the glue film being interposed therebetween.

Figure 2A:
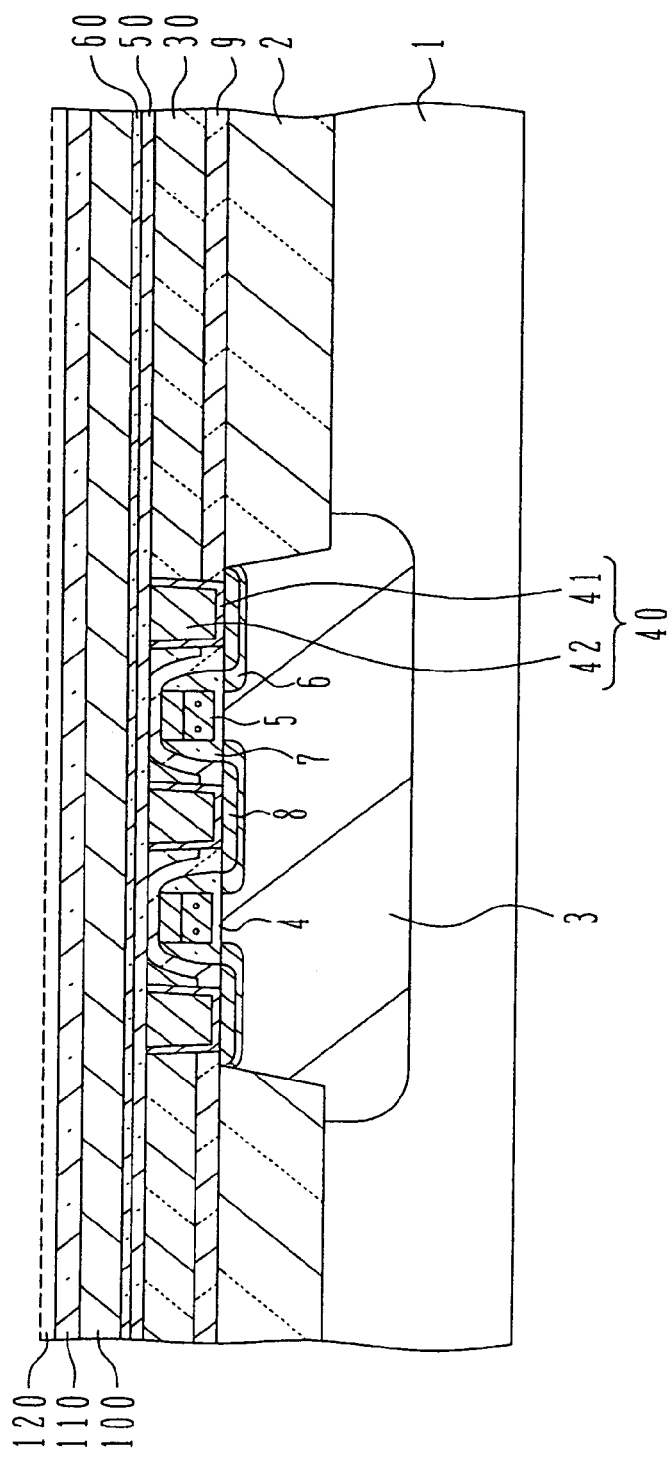

FIGS. 2A to 8C are cross sectional views illustrating the manufacture processes for a semiconductor device according to the first embodiment of the present invention. As shown in FIG. 2A, an element isolation region 2 is formed in the surface of a silicon substrate 1 by shallow trench isolation (STI), and a well 3 having a desired conductivity type is formed. A p-type well is formed in the region where an n-channel MOS transistor is to be formed.

A gate insulating film 4 is formed on the surface of an active region defined by the element isolation region 2, and on this gate insulating film a gate electrode 6 is formed which is made of a polycide lamination of a polysilicon layer and a silicide layer. Impurity ions of n-type are implanted into the active region on both sides of the gate electrode to form extension regions 6. After side wall spacers 7 are formed on the side walls of the gate electrode, n-type impurity ions are implanted to form source/drain regions 8 and complete a MOS transistor structure. A cover film 9 is formed covering the MOS transistor structure.

Figure 2D:
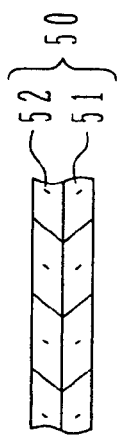
Figure 2C:
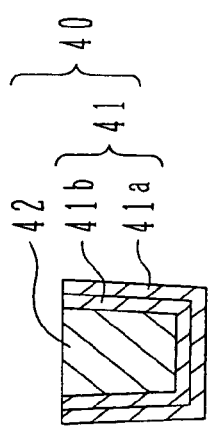
Figure 2B:
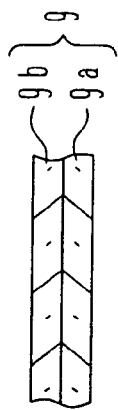

For example, as shown in FIG. 2B, the cover film 9 is a lamination of a silicon oxide film 9a having a thickness of 20 nm and a silicon nitride film 9b having a thickness of 80 nm, is formed on the whole surface of the substrate by plasma CVD.

Reverting to FIG. 2A, a plasma TEOS silicon oxide film 30 having a thickness of 1000 nm is deposited on the cover film 9, and polished by chemical mechanical polishing (CMP) to a thickness of 700 nm. In this manner, a first interlayer insulating film is formed.

Tungsten plugs 40 are buried in the first interlayer insulating film 30, first, contact holes are etched to expose the source/drain regions of the MOS transistors. A diameter of the contact hole is, for example, 250 nm.

As shown in FIG. 2C, a glue film 41 of a lamination of a Ti layer 41a having a thickness of 30 nm and a TiN layer 41b having a thickness of 20 nm is deposited and a tungsten film 42 is then deposited. An unnecessary portion on the first interlayer insulating film is removed by CMP to form tungsten plugs 40. Other conductive materials such as TiN and Si may be used as the lower conductive plug.

An oxidation preventive film 50 is formed on the first interlayer insulating film, covering the tungsten plugs 40, to prevent the tungsten plug from being oxidized by a later oxidizing atmosphere.

For example, as shown in FIG. 2D, the oxidation preventive film 50 is made of a lamination of a silicon oxynitride (SiON) film 51 having a thickness of 100 nm and a TEOS silicon oxide film 52 having a thickness of 130 nm deposited by plasma CVD.

An alumina film 60 is deposited on the oxidation preventive film 50. On the alumina film 60, for example, a Pt lower electrode 100 having a thickness of 130 to 180 nm and a PZT ferroelectric film 110 having a thickness of 130 to 180 nm are formed. The alumina film 60 has a function of improving crystallinity of the Pt film 100 and PZT film 110. After the PZT ferroelectric film is formed, crystallization annealing is performed.

A portion of an IrO upper electrode 120 is formed on the PZT ferroelectric film 110, and crystallization annealing is performed again. Thereafter, a remaining thickness portion of the IrO upper electrode 120 is formed to obtain an IrO upper electrode having a thickness of 200 to 300 nm.

Figure 3:
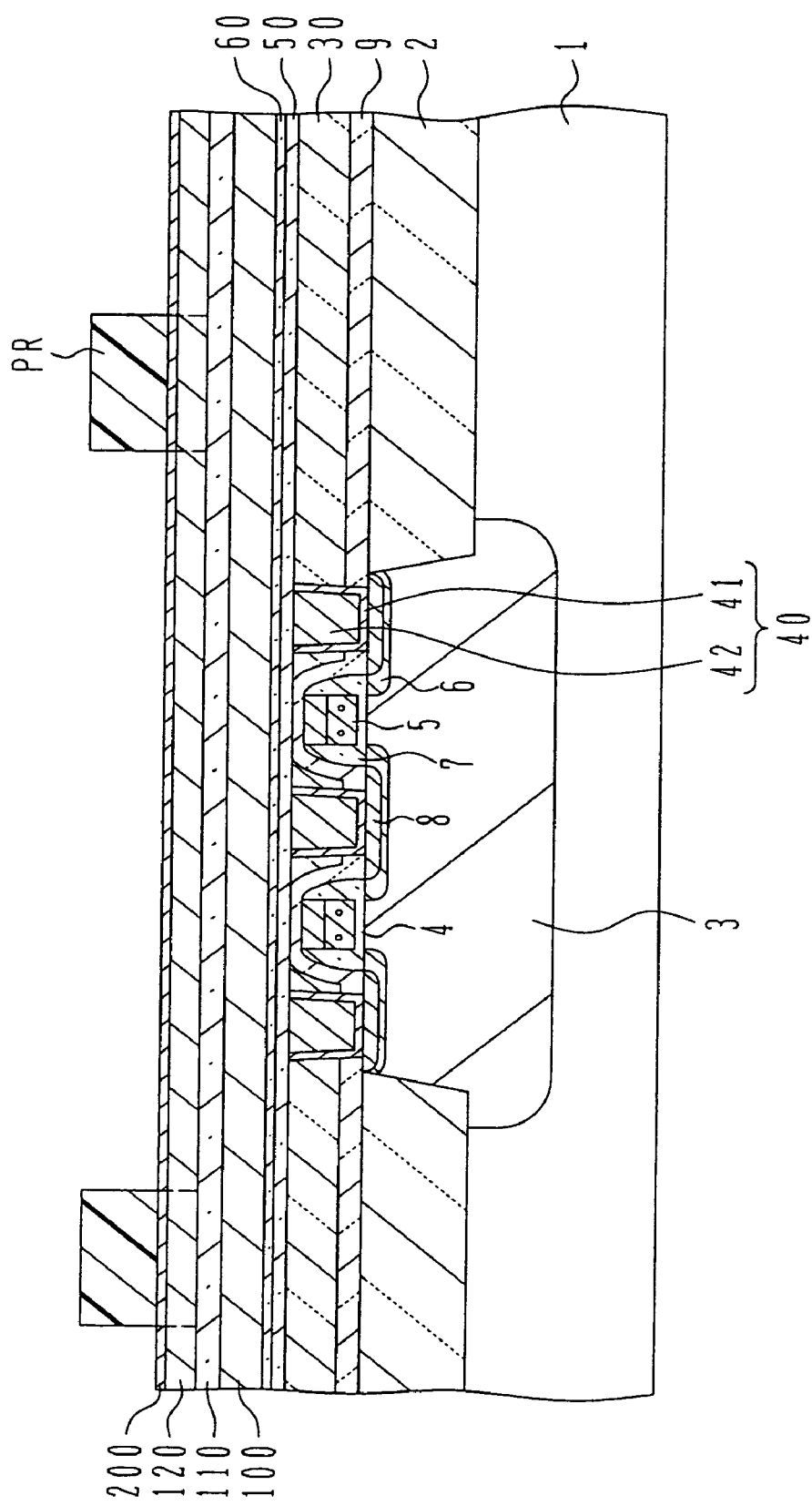

As shown in FIG. 3, a hydrogen shielding metal film 200 is formed on the upper electrode 120. For example, a Pt film having a thickness of 30 to 100 nm is formed. The hydrogen shielding metal film 200 is a film functioning to block hydrogen and its thickness is preferably set to 30 nm or thicker, and not thicken than a half of the thickness of the upper electrode 120. An Ir film may be used instead of the Pt film.

By using a resist pattern PR as a mask, the hydrogen shielding metal film 200 and upper electrode 120 are etched to expose the ferroelectric film 110. Next, a resist pattern having a shape protruding from the upper electrode is formed on the ferroelectric film 110, and the ferroelectric film 110 is etched to expose the lower electrode 100. Similarly, the lower electrode 100 protruding the ferroelectric film is patterned. A ferroelectric capacitor is therefore formed which has a tiered stand (or stepped lamination) shape with the lower stage being protruded more.

Figure 4:
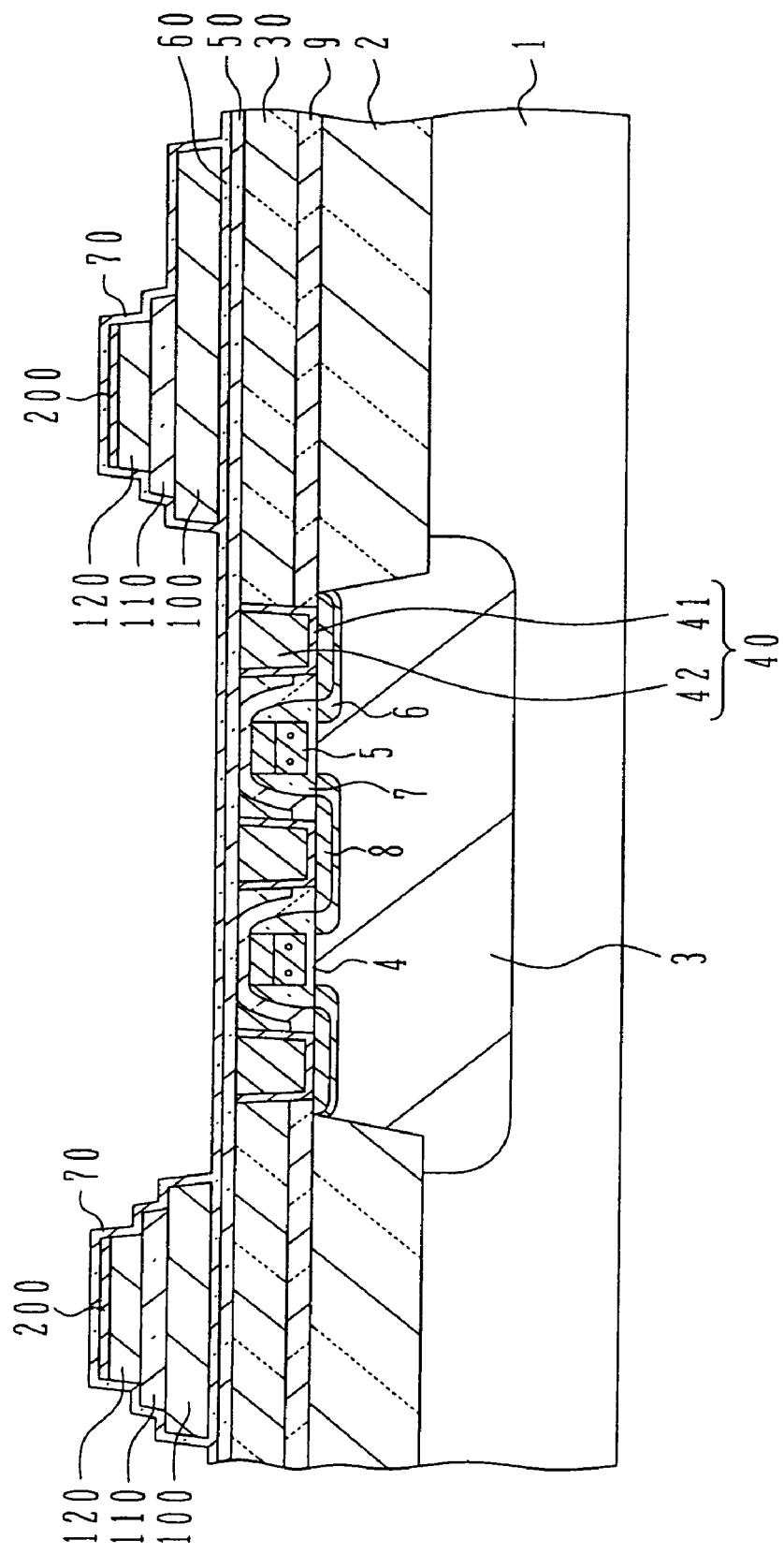

As shown in FIG. 4, an alumina film 70 is formed on the surface of the formed ferroelectric capacitor to envelope the capacitor together with the alumina film 60 under the lower electrode. Annealing is performed in an oxygen atmosphere, for example, for 60 minutes at 650° C. to recover the ferroelectric capacitor characteristics degraded by the etching process and the like.

Figure 5:
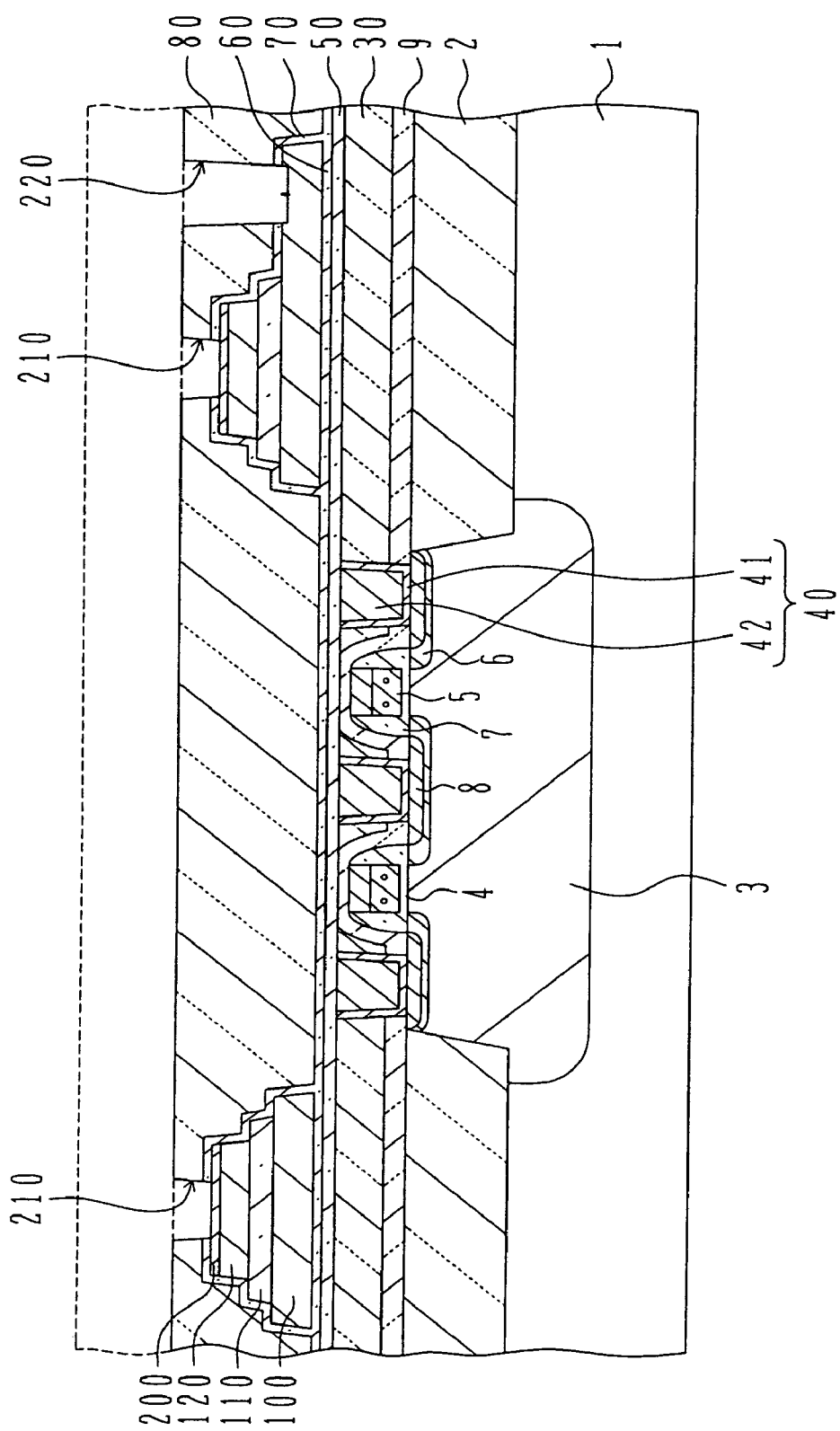

As shown in FIG. 5, a TEOS silicon oxide film 80 having a thickness of, e.g., 1500 nm, is formed by plasma CVD, covering the ferroelectric capacitor, and polished by CMP to a remaining thickness of 1000 nm to obtain a planarized surface. $N_2O$ plasma annealing is performed to dehydrate the second interlayer insulating film 80.

Next, contact holes 210 and 220 are formed reaching the upper electrode 120 and lower electrode 100 of the ferroelectric capacitor, respectively. After this etching, annealing for recovering the ferroelectric capacitor characteristics degraded by processes is performed in an oxygen atmosphere, for example, for 60 minutes at 450 to 550° C.

Figure 6:
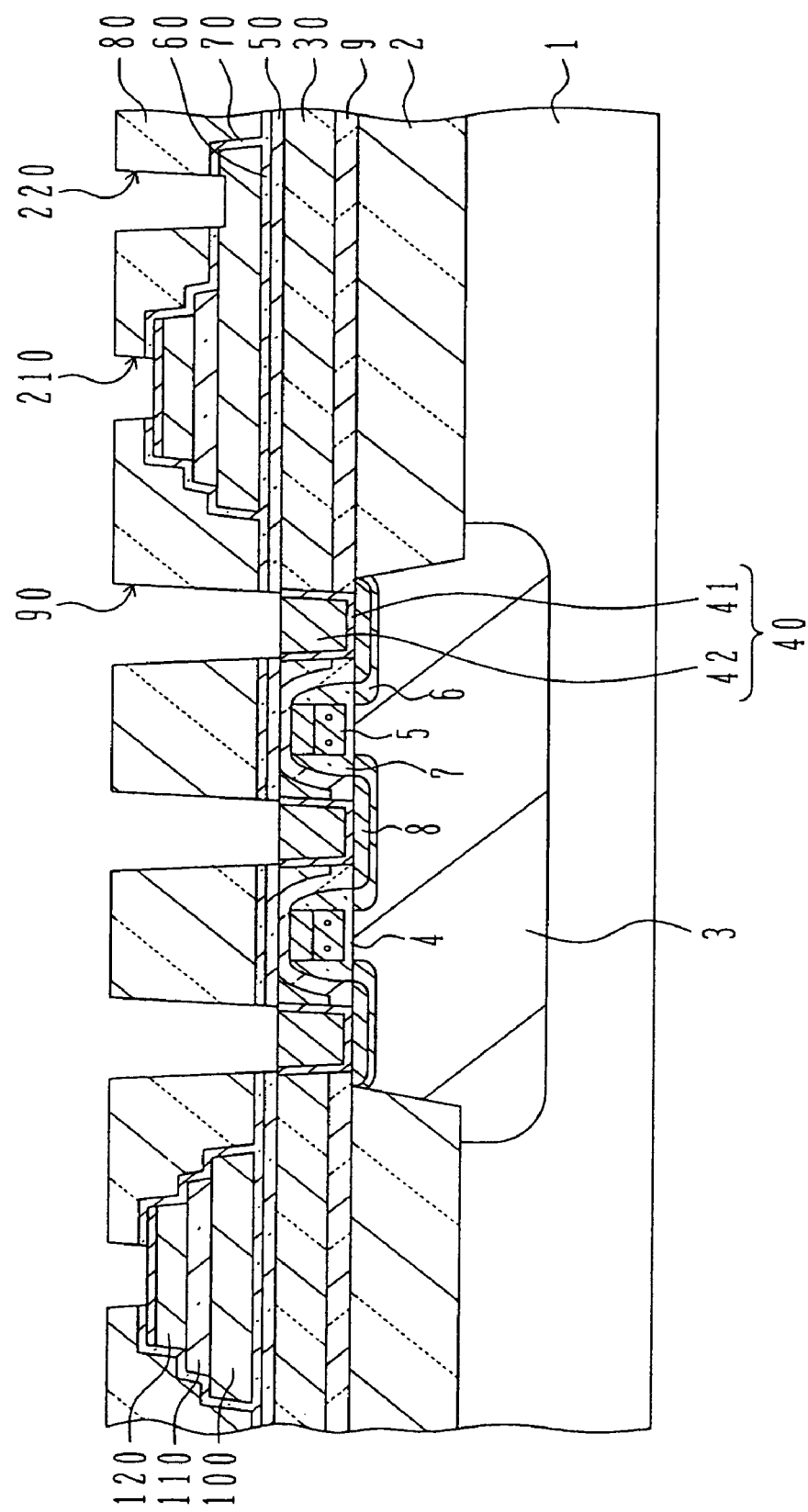

As shown in FIG. 6, contact holes 90 are formed through the second interlayer insulating film 80, alumina film 70, and oxidation preventive film 50 to expose the surfaces of the tungsten plugs 40 buried in the first interlayer insulating film 30 as the lower conductive plugs. Thereafter, an RF preprocess is performed to etch the surface by several tens nm based on oxide film etching, e.g., by 10 nm oxide film equivalent etching, to thereby make clean the conductive layers exposed in the contact holes.

As shown in FIG. 7A, a TiN glue film 230 having a thickness of 50 to 150 nm is formed by sputtering on the inner walls of the contact holes 90, 210 and 220.

As shown in FIG. 7B, as the glue film 230, a Ti film 231 may be formed by sputtering and a TiN film 232 is formed on the Ti film by CVD. If the TiN film is formed by MOCVD, $N_2/H_2$ plasma annealing is performed thereafter at 400° C. or higher to remove carbon contained in the TiN film. Since the hydrogen shielding Pt film 200 is formed on the upper electrode 120, annealing even in the hydrogen atmosphere will not reduce the upper electrode 120 of noble metal oxide.

Reverting to FIG. 7A, a W film 240 is formed on the glue film 230 by CVD to bury the contact holes. Thereafter, an unnecessary conductive film on the second interlayer insulating film 80 is removed by CMP. In this manner, tungsten plugs 250 are buried in the second interlayer insulating film 80.

Figures 8A, 8B, 8C:
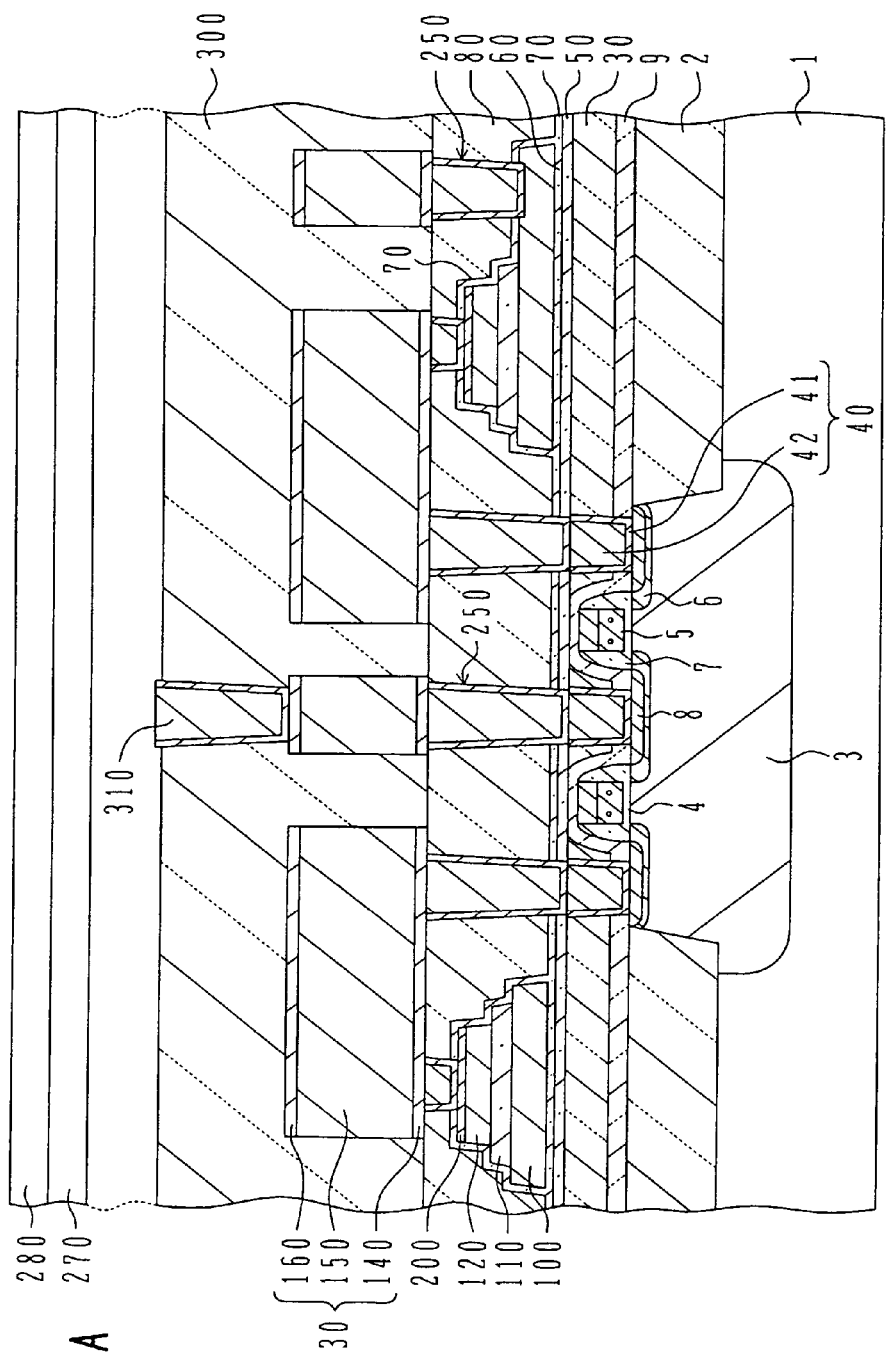

As shown in FIG. 8A, on the second interlayer insulating film 80 burying the tungsten plugs 250, a low barrier metal layer 140, an aluminum main wiring layer 150 and an upper barrier metal layer 160 are deposited to form an aluminum wiring layer 130.

For example, as shown in FIG. 8B, the lower barrier metal layer 140 is a lamination of a Ti layer 141 having a thickness of 40 to 80 nm and a TiN layer 142 having a thickness of 20 to 40 nm. The aluminum main wiring layer 150 on the lower barrier metal layer is formed, for example, by an Al—Cu alloy layer having a thickness of 300 to 400 nm.

For example, as shown in FIG. 8C, the upper barrier metal layer 160 is a lamination of a Ti layer 161 having a thickness of 3 to 8 nm and a TiN layer 162 having a thickness of 50 to 90 nm. An SiON antireflection film 170 is formed on the TiN layer.

A resist pattern is formed on the antireflection film, and the aluminum wiring layer is patterned to form aluminum wirings 130. These aluminum wirings have the same structure as that of aluminum wirings used in the logic circuit so that process capability and reliability can be retained. Thereafter, a third interlayer insulating film 300 is formed and planarized by CMP, and a third tungsten plug 310 is buried in the third interlayer insulating film.

Similarly, second, third, . . . aluminum wirings are formed as many layers as necessary. On the wirings, a first cover film 270 and a second cover film 280 are formed. For example, the first cover film 270 is formed by a high density plasma (HDP) undoped silicon oxide (undoped silicate glass, USG) film having a thickness of 700 to 800 nm, and the second cover film 280 is formed by a silicon nitride film having a thickness of 400 to 600 nm. At the same time as the wirings are formed, pads are also formed. A polyimide film is formed and patterned to complete a semiconductor device having FeRAM.

Prototype samples were formed by using the above-described embodiment method, each prototype sample had the structure that a lamination of a Pt lower electrode having a thickness of 150 nm, a PZT ferroelectric film having a thickness of 150 nm, an IrO upper electrode having a thickness of 200 nm and a Pt hydrogen shielding layer having a thickness of 100 nm stacked in this order from the bottom was connected to first aluminum wirings via tungsten plugs. Contact resistances of the upper and lower electrodes of each prototype sample were measured. The resistance per 100 contacts was measured by connecting a number of contacts in a chain connection. For comparison, comparative samples without the Pt hydrogen shielding layer were formed and their resistances were measured. Contact resistances were also measured after annealing for 30 minutes at 420° C. in $N_2$ atmosphere.

The contacts to the lower electrodes are the same for both the prototype samples and comparative samples. Before annealing, the lower electrode contact resistance of the comparative samples was 2.24 Ω/via, and the lower electrode contact resistance of the prototype samples was 2.26 Ω/via. These contact resistances are considered to be almost equal.

FIG. 9 is a graph showing the measurement results of the upper electrodes. A circle symbol indicates a measured value before annealing, and a triangle symbol indicates a measured value after annealing. As shown in FIG. 9, the contact resistance of the upper electrode before annealing is 6.94 Ω/via for the comparative samples without the Pt hydrogen shielding metal film, and 2.29 Ω/via for the prototype samples with the Pt hydrogen shielding metal film. The contact resistance of the upper electrode with the Pt hydrogen shielding film is 2.29 Ω/via which is almost equal to that of the lower electrode, whereas the contact resistance without the Pt hydrogen shielding film is 6.94 Ω/via which is a twofold or more. It can be understood that the contact resistance of the upper electrode can be lowered greatly by forming the Pt hydrogen shielding film on the upper electrode.

After annealing at 420° C., the contact resistance of the upper electrode of the prototype samples with the Pt hydrogen shielding film shows no significant change, whereas the contact resistance of the upper electrode of the comparative samples without the Pt hydrogen shielding film rises by about three times. It can be understood that stability against a thermal load can also be given by forming the Pt hydrogen shielding film on the IrO upper electrode.

The capacitor characteristics of the prototype samples and comparative samples were also measured relative to a switching charge amount. The switching charge amount was 23.5 μC/cm$^2$ for the comparative samples without the Pt hydrogen shielding film, and 28.6 μC/cm$^2$ for the prototype samples with the Pt hydrogen shielding film. The switching charge amount is improved by about 20%.

After the upper electrode 120 is deposited and etched, recovery annealing is usually performed for 60 minutes at 650° C. in the oxygen atmosphere. This annealing is performed to remove damages of the upper electrode during film forming and etching processes.

Figure 10A:
FIGS. 10A and 10B are SEM photographs showing upper electrode surfaces of samples formed by the method of the first embodiment.
Figure 10B:
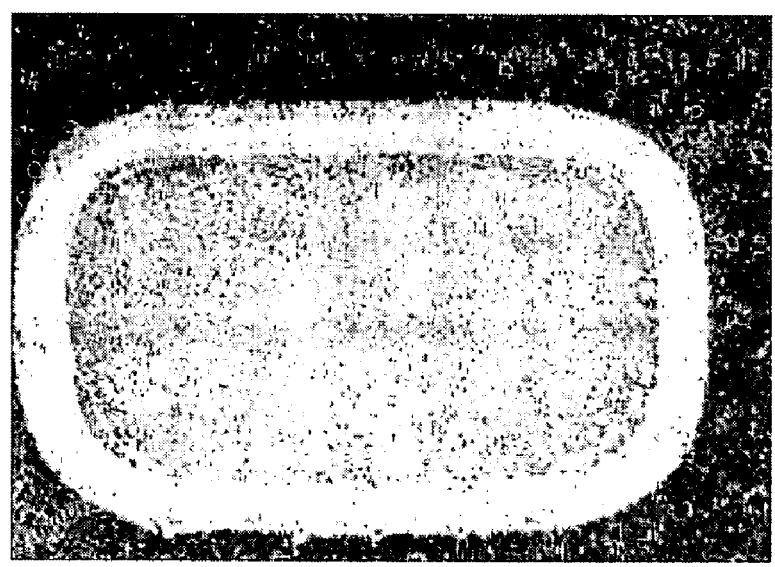

FIGS. 10A and 10B are SEM photographs showing the capacitor surfaces of a comparative sample and a prototype sample after recovery annealing in oxygen after etching the upper electrode. FIG. 10A shows the capacitor surface in which Pt hydrogen shielding film 200 was not formed and annealing was performed after the IrO upper electrode 120 was formed. Foreign matters and concave/convex portions exist on the surface. This phenomenon is likely to occur when a Pb amount in the PZT film 110 is large and an exposure ratio of the PZT film in the wafer is large (or the upper electrode occupying area ratio is smaller). These foreign matters on the surface are considered to be formed when Pb evaporates from PZT and reacts with IrO.

FIG. 10B shows the capacitor surface in which annealing was performed after the Pt hydrogen shielding film 200 was formed on the IrO upper electrode. No concave/convex portion exists on the surface and the surface state is improved. This can be ascribed to that the reaction is suppressed by covering the IrO surface with the Pt film.

When FeRAM is formed in the manner shown in FIGS. 8A to 8C, the oxidation preventive film 50 such as SiON+TEOS films and alumina film 70 are placed under the ferroelectric capacitor. Therefore, during CMP of the interlayer insulating film 80, a remaining film thickness on the STI element isolation region 2 cannot be monitored. A film thickness on the upper electrode cannot be measured correctly if the upper electrode is made of only the IrO film because reflection therefrom is poor. The polishing amount has been estimated by confirming the remaining film thickness through cross sectional SEM using a pilot wafer. As the Pt hydrogen shielding film 200 is formed on the IrO upper electrode 120, reflection of light is high so that a film thickness can be measured optically. Since the remaining film thickness on the upper electrode can be monitored, it is possible to avoid the problem of exposure of the ferroelectric capacitor due to excessive CMP polishing. Since the pilot wafer is not required, which is used for cross sectional SEM and then scapped, a cost can be reduced. A film thickness on the Pt lower electrode 100 can also be measured so that the remaining film thickness administration is possible.

When the Pt hydrogen shielding film was not formed on the IrO upper electrode and the RF process before depositing the glue film was omitted, the contact resistance of the upper electrodes rose by about threefold. Therefore, the RF process before depositing the glue film was almost essential. An increase in the contact resistance was not observed even if the RF process is omitted for the structure having the Pt lower electrode, IrO upper electrode and Pt hydrogen shielding film. Therefore, the RF process may be omitted. If the RF process is omitted, the Pt hydrogen shielding film may be deposited thinner. Etching the ferroelectric capacitor becomes easy.

In the above-described embodiment, as shown in FIG. 5, after the contact holes for the upper and lower electrodes of the ferroelectric capacitor are formed and recovery annealing is performed, contact holes for the lower conductive plugs are opened as shown in FIG. 6, and various tungsten plugs are formed at the same time as shown in FIG. 7A.

Figure 11:
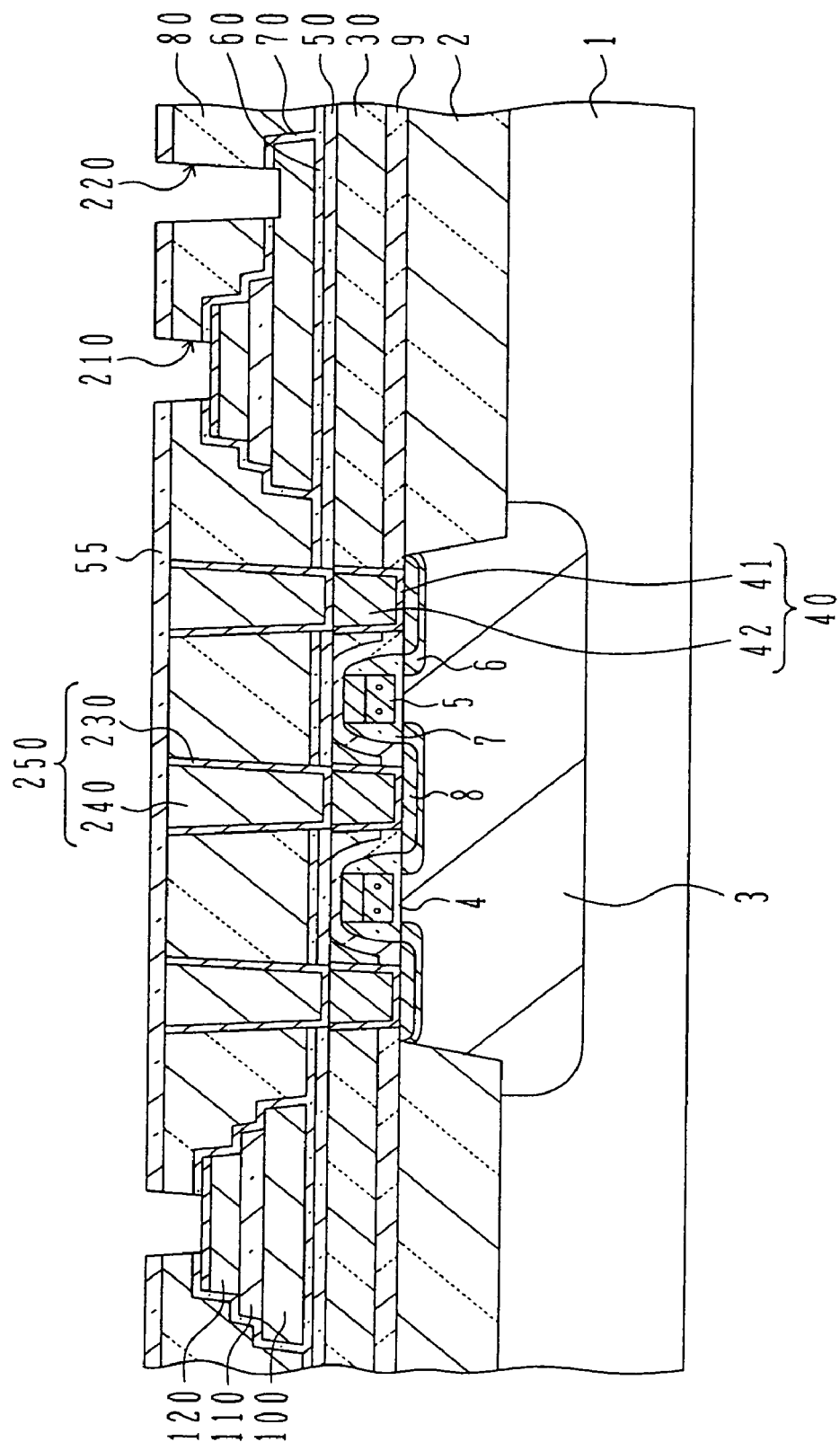
FIG. 11 is a cross sectional view illustrating a method of manufacturing a semiconductor device having an FeRAM according to a first modification of the first embodiment.

FIG. 11 is a cross sectional view of a semiconductor device according to a modification of the embodiment. After a second interlayer insulating film 80 is deposited and planarized by CMP, contact holes for the lower conductive plugs are formed through the second interlayer insulating film. A glue film 230 constituted of a Ti film having a thickness of 20 nm and a TiN film having a thickness of 50 nm is formed in the inner wall of the contact hole exposing the lower conductive plug, and a tungsten film 240 is formed to form a tungsten plug 250 buried in each contact hole.

Thereafter, a silicon oxynitride film having a thickness of 100 nm is deposited to form an oxidation preventive film 55. Next, contact holes 210 and 220 for the upper and lower electrodes of the ferroelectric capacitor are formed through the oxidation preventive film 55 and interlayer insulating film 80. In this state, recovery annealing is performed for 60 minutes at 500° C. in oxygen atmosphere. The tungsten plug 250 is prevented from being oxidized because it is covered with the oxidation preventive film 55.

The oxidation preventive film 55 is thereafter etched and removed, and a glue film is formed by forming a TiN film having a thickness of 75 nm by the process similar to that shown in FIG. 7A. On the glue film, a tungsten film is deposited, and an unnecessary portion thereof is removed by CMP to form tungsten plugs buried in the contact holes 210 and 220. Thereafter, the processes similar to those of the above-described embodiment are performed.

Figure 12:
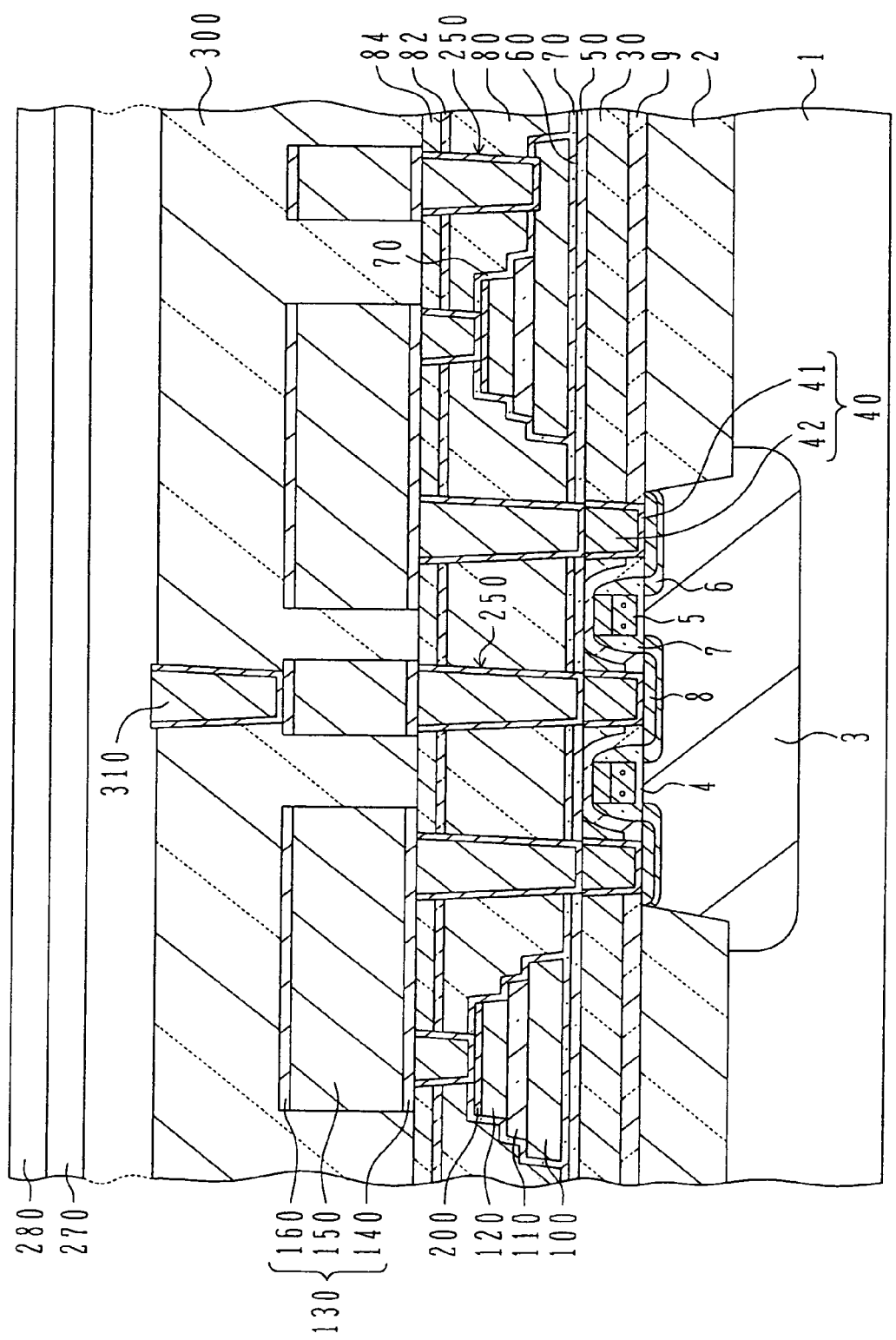
FIG. 12 is a cross sectional view illustrating a method of manufacturing a semiconductor device having an FeRAM according to a second modification of the first embodiment.

FIG. 12 is a cross sectional view of a semiconductor device according to another modification of the embodiment. A second interlayer insulating film 80 is deposited and planarized, and annealing for dehydration is performed. Then an alumina film 82 having a thickness of 50 nm is formed. An auxiliary interlayer insulating film 84 having a thickness of 200 nm is formed on the alumina film 82. This structure has a lamination of the interlayer insulating film 80, alumina film 82 and auxiliary interlayer insulating film 84, replacing the second interlayer insulating film 80 of the embodiment. Since the ferroelectric capacitor enveloped with the alumina film 60, 70 is further covered with the alumina film 82 and tungsten plug, the anti-moisture performance can be improved.

In the above-described embodiment, the ferroelectric capacitor is formed on the element isolation region and the lead wiring of the capacitor electrode is formed from the upper side via the contact hole. The ferroelectric capacitor may be formed on the conductive plug to reduce the occupation area.

Figure 13:
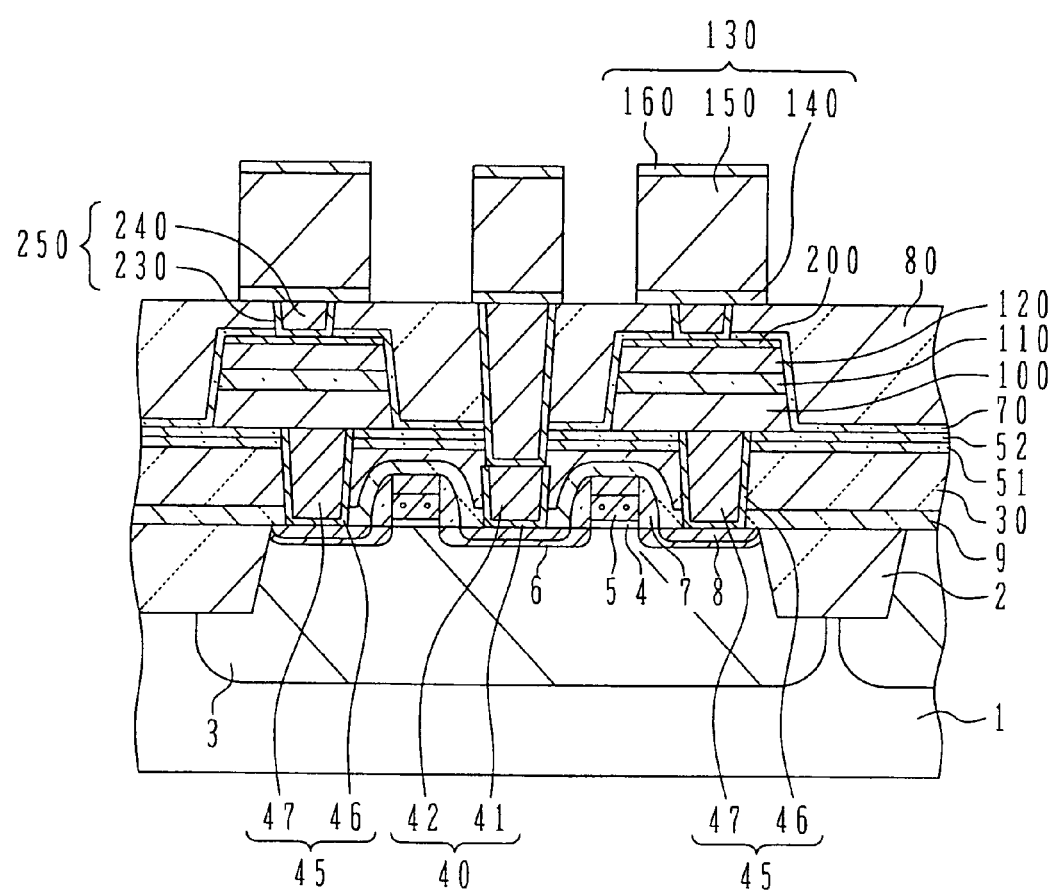
FIG. 13 is a cross sectional view showing the structure of a semiconductor device having an FeRAM according to a second embodiment.

FIG. 13 is a cross sectional view of a semiconductor device adopting a so-called stack capacitor structure according to the second embodiment. Description will be directed mainly to different points from the first embodiment. The processes of forming an element isolation region, wells, MOS transistors, a cover film 9 and an interlayer insulating film 30 are similar to those of the first embodiment. At this stage, a tungsten plug 40 is formed on the common drain region shown in the central area of FIG. 13 by the process similar to that of the first embodiment.

An oxidation preventive film 51 and a silicon oxide film 52 are formed on the interlayer insulating film 30 by the process similar to that of the first embodiment, covering the tungsten plug 40. A different point resides in that a tungsten plug is not formed at this stage on opposite source regions. Thereafter, contact holes are formed to expose the opposite source regions, a glue film 46 and a tungsten film 47 are deposited and an unnecessary portion thereof is removed by CMP to form tungsten plugs 45.

A lower electrode 100 connected to the tungsten plug 45, a ferroelectric film 110, an upper electrode 120 and a hydrogen shielding metal film 200 are deposited and etched by using the same mask to form ferroelectric capacitors. An alumina film 70 is deposited covering the ferroelectric capacitors, and a second interlayer insulating film 80 is formed thereon.

Contact holes are formed exposing the tungsten plug 40 and the hydrogen shielding film 200 on the upper electrode 120, and tungsten plugs 250 are formed by using a glue film 230 and a tungsten film 240. A lower barrier metal film 140, an aluminum main wiring layer 150 and an upper barrier metal film 160 are formed on the interlayer insulating film 80 to form aluminum wirings 130 connected to the tungsten plugs 250. Since the areas occupied by the capacitors are superposed upon the MOS transistors, the substrate area can be utilized efficiently.

In the embodiments described above, a TiN film or a Ti film + a TiN film are used as the glue film of the tungsten plug. In the process of opening a contact hole for the upper electrode of the ferroelectric capacitor, forming a TiN glue film and forming a W film at a high temperature, if the TiN film is oxidized by oxygen degassed from the IrO upper electrode of PZT ferroelectric film, insulating titanium oxide is formed. This may result in the problem of an increase in the contact resistance of the upper electrode or instability of the contact resistance. In order to improve the anti-oxidation performance, it is preferable to use TiAlN instead of TiN for the material of the glue film 230. For example, an alloy target having a composition $Ti_{85}Al_{15}$ is placed in a reaction chamber of a DC magnetron sputtering system, and Ar at 16 sccm and $N_2$ at 100 sccm are introduced while a wafer is heated to 200° C. After the pressure is stabilized at 3.8 mtorr, a DC power at 18 kW is supplied to start discharge. For example, a TiAlN film having a thickness of 75 nm is formed. The composition of the formed TiAlN film was $Ti_{80}Al_{20}N$. Since this composition is relatively similar to that of TiN, the W film can be formed thereon.

In order to enhance the anti-oxidation performance, the Al composition may be increased. As the Al composition is increased, it may become difficult to form a W film on the TiAlN film. In such a case, as shown in FIG. 7B, first a TiAlN film is formed as the lower glue film 231 and then a TiN film is formed as the upper glue film 232. In this case, W nuclei (nucleation) can be formed easily.

The void shown in FIG. 1 may be ascribed to that hydrogen at a high temperature permeates through the TiN glue film and reaches the IrO upper electrode during the W film forming process after the TiN glue film of the tungsten film is formed by sputtering. It is possible to improve the W film forming process.

FIG. 14A shows the details of a conventional W film forming process. This table lists a time (sec), a pressure (Pa), a temperature (° C.), a $WF_6$ flow rate (sccm), an Ar flow rate (sccm), an $SiH_4$ flow rate (sccm), an $H_2$ flow rate (sccm), and an $N_2$ flow rate (sccm) at each Step number. The whole process is constituted of nine Steps and the temperature is constant at 410° C. for all Steps.

At Step 1, gas is not supplied to a reaction chamber, and this Step is a preliminary step of exhausting gas. At Steps 2 and 3, $WF_6$ gas as W source is not still flowed, but Ar, $SiH_4$, $H_2$ and $N_2$ are introduced and a pressure is maintained at 2667 Pa. Si nuclei are attached. At Steps 4 and 5, $WF_6$ gas is introduced to attach W nuclei. Steps 2 to 5 are collectively called initial deposition. For example, an initial W film having a thickness of 80 nm is formed.

Steps 6 and 7 are main deposition. $WF_6$ gas and $H_2$ gas are supplied as reaction source gas along with Ar and $N_2$. The flow rate of $SiH_4$ is dropped to 0. For example, a W film having a thickness of 220 nm is grown and has a total thickness of 300 nm. At Step 8, supply of $WF_6$ is stopped. This gas is switched to a vent line to dump the gas. At Step 9, supply of all gasses is stopped and the pressure is dropped to 0.

Reduction of the IrO upper electrode is considered to be conducted mainly by $H_2$ gas in the initial deposition. At Steps 2, 4 and 5 among other Steps, $H_2$ at 1000 sccm or larger is supplied, and Step 5 continues for a long time of 86 seconds. Although $H_2$ at 1500 sccm is supplied also at Step 6 in the main deposition, it can be considered that the probability that hydrogen reaches the IrO upper electrode is lowered because this Step is performed after the initial deposition and the initial W film is already formed.

FIG. 14B shows a W film forming process according to the embodiment of the present invention. A different point from the W film forming process shown in FIG. 14A is that $H_2$ gas is not supplied during the initial deposition. Even if $SiH_4$ is dissolved and H is generated, the amount of this H is very small. By suppressing the amount of hydrogen, damages to the oxide upper electrode and the oxide ferroelectric film can be reduced during the W film forming process. Similar effects are expected if the $H_2$ gas flow rate is sufficiently suppressed even if the flow rate is not set to 0. For example, the average $H_2$ gas flow rate during the main deposition is lowered to one fifth or lower.

If a Ta film or a TaN film is formed as the lower glue film 231 shown in FIG. 7B and a TiN film is formed thereon, the hydrogen shielding performance is expected to be improved. A Ta film or a lamination of a TaN film and a Ti film may be used as the lower glue film.

The present invention has been described in connection with the preferred embodiments. The invention is not limited only to the above embodiments. For example, the structure of FeRAM and its manufacture method described in the embodiments of Japanese Patent Laid-open Publication No. 2004-193430, which is incorporated herein by refernce, may be adopted when appropriate. It will be apparent to those skilled in the art that other various modifications, improvements, combinations, and the like can be made.

What we claim are:

1. A semiconductor device comprising:
   a semiconductor substrate;
   a MOS transistor formed in said semiconductor substrate and having an insulated gate and source/drain regions on both sides of said insulated gate;
   a ferroelectric capacitor formed over said semiconductor substrate and having a lower electrode, a ferroelectric layer and an upper electrode;
   a metal film formed over said upper electrode and having a thickness of half of or thinner than a half of a thickness of said upper electrode;
   an alumina film covering said ferroelectric capacitor;
   an interlayer insulating film formed directly on said alumina film;
   a contact hole formed through said interlayer insulating film, exposing said metal film;
   a conductive glue film covering an inner surface of said contact hole, consisting of TiAlN; and
   a conductive plug burying said contact hole;
   wherein said metal film is a Pt film and said upper electrode has a thickness of 200 nm to 300 nm.

2. The semiconductor device according to claim 1, wherein said lower electrode is a Pt film.

3. The semiconductor device according to claim 1, wherein said ferroelectric layer is a PZT layer.

4. The semiconductor device according to claim 1, wherein said upper electrode is an $IrO_X$ layer.

5. The semiconductor device according to claim 1, further comprising:
   an aluminum wiring formed on said interlayer insulating film and connected to said conductive plug.

6. The semiconductor device according to claim 1, wherein said lower electrode is a Pt layer, and said upper electrode is an IrO layer.

* * * * *